(12) United States Patent
Heo

(10) Patent No.: US 7,843,135 B2
(45) Date of Patent: Nov. 30, 2010

(54) ORGANIC LIGHT-EMITTING DIODE DISPLAY AND METHOD OF MANUFACTURING THE SAME

(75) Inventor: Se Jun Heo, Ulsan-si (KR)

(73) Assignee: Samsung Mobile Display Co., Ltd., Suwon-si, Gyeonggi-do (KR)

(*) Notice: Subject to any disclaimer, the term of this patent is extended or adjusted under 35 U.S.C. 154(b) by 341 days.

(21) Appl. No.: 11/637,779

(22) Filed: Dec. 13, 2006

(65) Prior Publication Data

US 2007/0132376 A1 Jun. 14, 2007

(30) Foreign Application Priority Data

Dec. 14, 2005 (KR) .................. 10-2005-0123217

(51) Int. Cl.
*H05B 33/04* (2006.01)
(52) U.S. Cl. ..................................... 313/512
(58) Field of Classification Search .................. 313/512
See application file for complete search history.

(56) References Cited

U.S. PATENT DOCUMENTS

| | | | |
|---|---|---|---|
| 6,236,444 B1 * | 5/2001 | Konuma et al. ............ 349/151 |
| 6,567,147 B1 * | 5/2003 | Hirakata ..................... 349/153 |
| 6,833,668 B1 | 12/2004 | Yamada et al. |
| 2002/0132385 A1 * | 9/2002 | Dojo et al. .................... 438/30 |
| 2003/0062186 A1 | 4/2003 | Boroson et al. |
| 2004/0075380 A1 | 4/2004 | Takemoto et al. |
| 2004/0262605 A1 | 12/2004 | Park et al. |
| 2005/0082972 A1 * | 4/2005 | Chen et al. .................. 313/512 |
| 2005/0140265 A1 * | 6/2005 | Hirakata ..................... 313/483 |
| 2005/0231107 A1 * | 10/2005 | Yamazaki et al. ........... 313/506 |
| 2006/0017382 A1 * | 1/2006 | Hu et al. ..................... 313/512 |
| 2006/0192915 A1 * | 8/2006 | Kimura ....................... 349/151 |

FOREIGN PATENT DOCUMENTS

| JP | 2000-173766 | 6/2000 |
|---|---|---|
| JP | 2002-287653 A | 10/2002 |
| KR | 1999-015674 | 3/1999 |
| KR | 2002-0027933 | 4/2002 |

* cited by examiner

*Primary Examiner*—Joseph L Williams
*Assistant Examiner*—Andrew J Coughlin
(74) *Attorney, Agent, or Firm*—Lee & Morse, P.C.

(57) ABSTRACT

An organic light-emitting diode (OLED) display including a substrate, an OLED, a driver IC electrically connected to the OLED, and a sealing substrate having inner and outer surfaces, wherein the sealing substrate is affixed to the substrate such that both the driver IC and the OLED are enclosed between the inner surface of the sealing substrate and the substrate.

20 Claims, 4 Drawing Sheets

ORGANIC LIGHT-EMITTING DIODE DISPLAY AND METHOD OF MANUFACTURING THE SAME

BACKGROUND OF THE INVENTION

1. Field of the Invention

The present invention relates to an organic light-emitting diode display and method of manufacturing the same. More particularly, the present invention relates to an organic light-emitting diode display and method of manufacturing thereof, having an improved moisture and contaminant protection of its driver IC.

2. Description of the Related Art

An organic light-emitting diode (OLED) display is a display device where voltage is employed in organic light emitting layers to combine electrons and holes for the purpose of exciting electrons in organic light emitting layers to cause the organic light emitting layers to emit photons in the form of visible light to form images. OLED displays have superior characteristics as compared to other displays, such as excellent visibility, light weight, reduced thickness, and relatively low power consumption.

An OLED display may include a substrate, an OLED having two electrodes with organic light-emitting layers therebetween, an integrated circuit (IC) component to drive the OLED display, and a sealing substrate. FIG. 1 illustrates a cross-sectional view of a structure of a known OLED display.

As illustrated in FIG. 1, a driver IC 30 may be directly mounted on a first substrate 10 using a chip on glass (COG) method. In particular, the driver IC 30 may be mounted on a first area of the first substrate 10, while an OLED 20 may be mounted on a second area of the first substrate 10, such that the driver IC 30 and the OLED 20 may be electrically connected by way of a signal line (not shown). A second substrate 40 may be applied to the second area of the first substrate with the OLED 20 therebetween, such that the OLED 20 may be enclosed by the second substrate 40, and thereby protected from moisture. The driver IC, however, remains unprotected and may be susceptible to corrosion and premature degradation.

Accordingly, there remains a need to improve the configuration of the OLED display in order to protect the driver IC from moisture and contaminants.

SUMMARY OF THE INVENTION

The present invention is therefore directed to an OLED display and method of manufacturing the same, which substantially overcome one or more of the disadvantages of the related art.

It is therefore a feature of an embodiment of the present invention to provide an OLED display having an improved configuration to protect its driver IC against moisture and contaminants.

It is another feature of an embodiment of the present invention to provide a method of manufacturing an OLED display having a configuration protecting its driver IC.

At least one of the above and other features and advantages of the present invention may be realized by providing an OLED display having a substrate, an OLED, a driver IC electrically connected to the OLED, and a sealing substrate having inner and outer surfaces and affixed to the substrate, wherein the driver IC and the OLED are enclosed between the inner surface of the sealing substrate and the substrate.

The OLED display of the present invention may also include an absorbing layer made of a hygroscopic material, a plurality of driver ICs, and a driver signal line having a data line and a scan line.

The driver IC of the present invention may be disposed on the inner surface of the sealing substrate.

The sealing substrate of the present invention may include protecting projections that may have a length longer than the thickness of the driver IC.

At least one of the above and other features and advantages of the present invention may be separately realized by providing a method of forming an OLED display, including providing a substrate, attaching an OLED to the substrate, providing a sealing substrate having inner and outer surfaces, attaching at least one driver IC between the inner surface of the sealing substrate and the substrate, electrically connecting the OLED to the driver IC, the OLED may be electrically connected to the driver IC by way of a driver signal line having electrode pads, and securing the sealing substrate and the substrate such that the driver IC and the OLED are enclosed between the inner surface of the sealing substrate and the substrate.

Securing of the sealing substrate and the substrate may also include attaching a hygroscopic layer to the inner surface of the sealing substrate and forming a predetermined space in an inert environment.

Attaching of the driver IC to the sealing substrate may be done by way of a COG method, and the driver signal line may be electrically connected to the driver IC by attaching the electrode pads to bumps of the driver IC. Connecting the OLED to the driver IC may include electrically connecting a data line of the driver signal line to at least one bump on one side of the driver IC and electrically connecting a scan line to at least one bump on another side of the driver IC.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
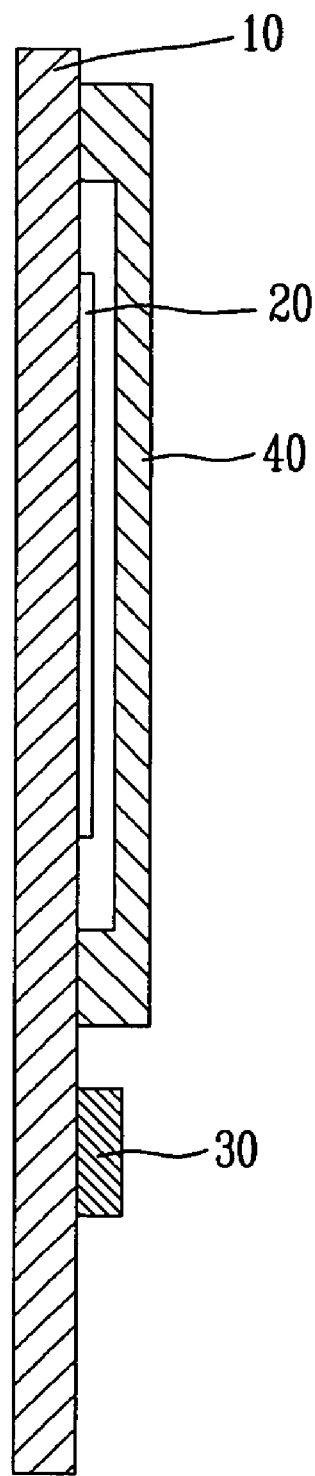
FIG. 1 illustrates a cross-sectional view of a known OLED display.

Korean Patent Application No. 10-2005-0123217, filed on Dec. 14, 2005, in the Korean Intellectual Property Office, and entitled: "Driver IC of Organic Light-Emitting Display Device and the Preparing Method of the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of elements and regions are exaggerated for clarity of illustration. It will also be understood that when an element is referred to as being "on" another element or substrate, it can be directly on the other element or substrate, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

Figure 2:
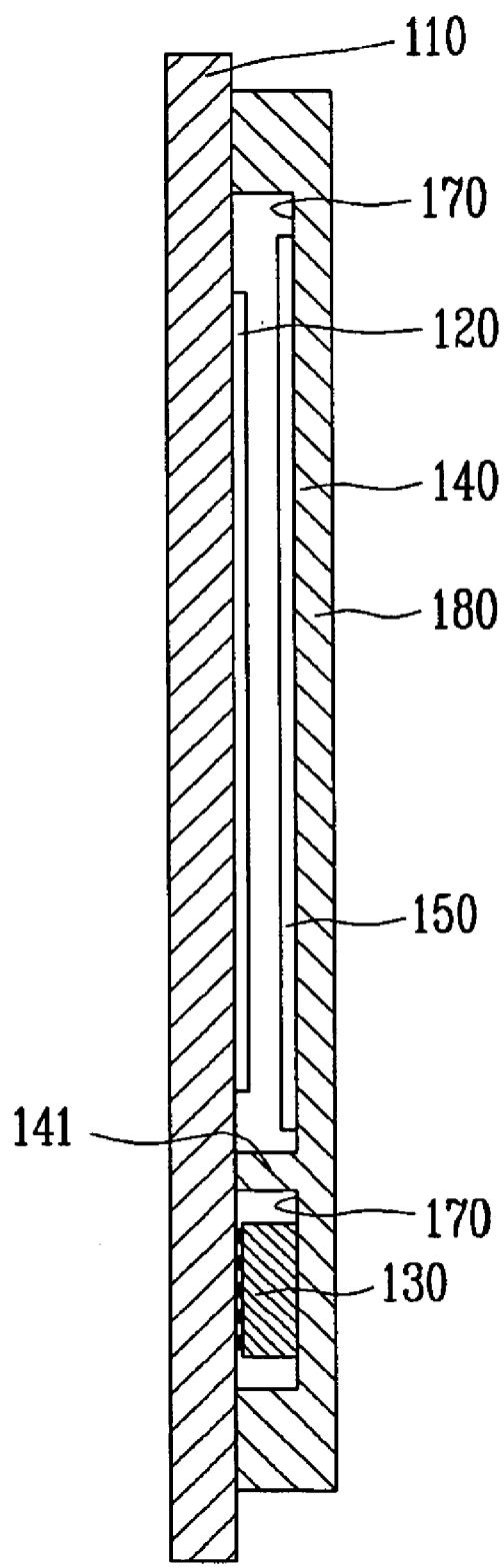
FIG. 2 illustrates a cross-sectional view of an OLED display according to an embodiment of the present invention.
Figure 3:
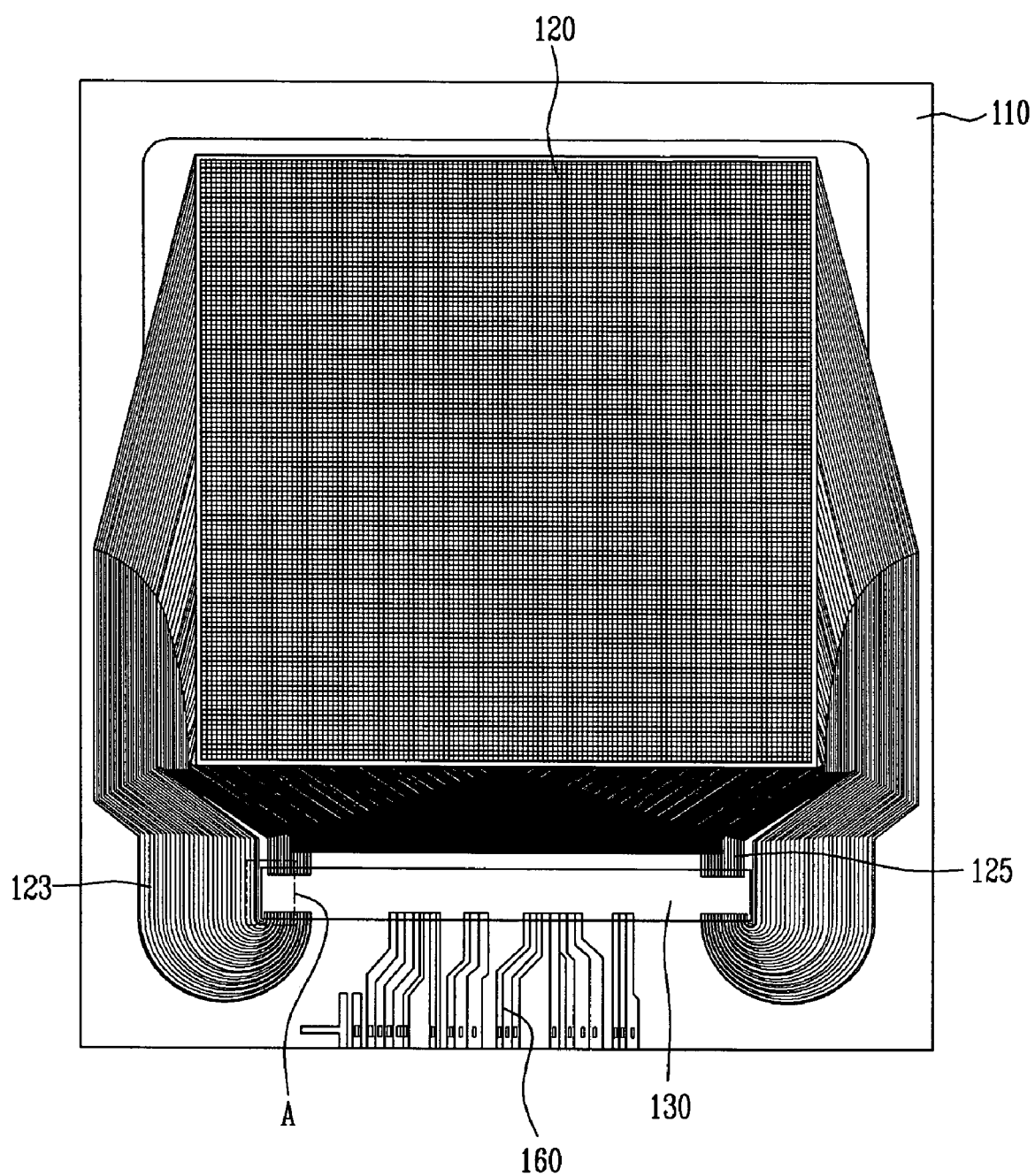
FIG. 3 illustrates a plan view of an OLED display according to an embodiment of the present invention.

An embodiment of an OLED display according to the present invention will now be described in detail with reference to FIGS. 2 to 4. As illustrated in FIG. 2, the OLED display may include a substrate 110, an OLED 120, a driver IC 130 to drive the OLED display either by passive or active driving type, and a sealing substrate 140.

The OLED 120 of the present invention may be disposed on the substrate 110, and it may include a pair of electrodes facing each other with at least one organic light-emitting layer interposed therebetween. The OLED 120 may also include a pixel matrix and a transistor. When at least one transistor device is employed in the pixel matrix of the OLED 120, the transistor may be electrically connected to a gate electrode and either a source electrode or a drain electrode.

As further illustrated in FIG. 2, the driver IC 130 of the present invention may be disposed on the sealing substrate 140 by a COG method or any other method known in the art, as will be discussed below. As illustrated in FIG. 3, the driver IC 130 may be electrically connected to the OLED 120 by way of a driver signal line containing a scan line 123 and a data line 125. The scan line 123 may transfer scan signal, while the data line 125 may transfer data signal. The respective ends of the lines 123 and 125 may include electrode pads (not shown) to enable electrical contact. The driver IC 130 may also include an input line 160 that transfers an external input signal.

Figure 4:
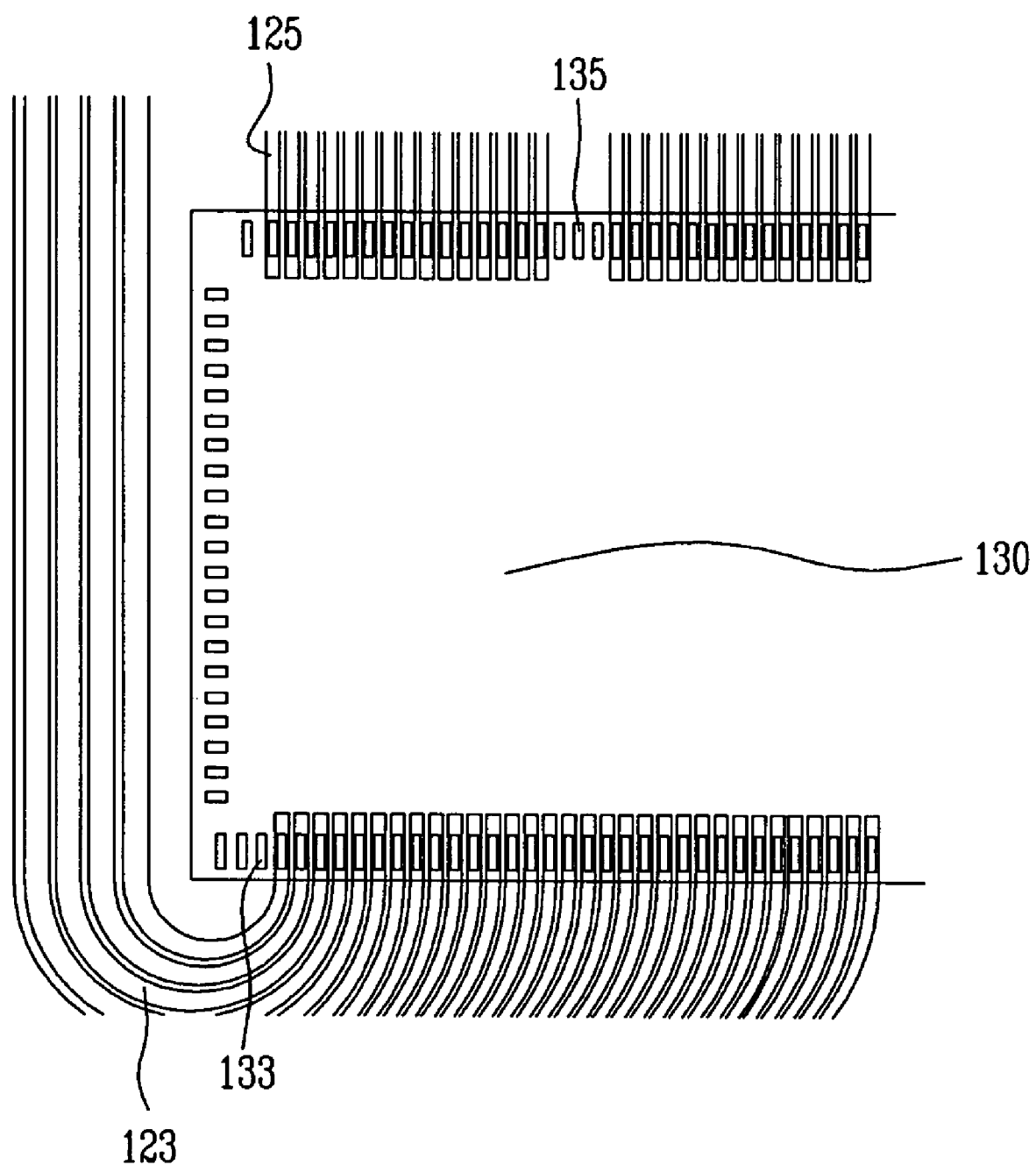
FIG. 4 illustrates an enlarged schematic view of section A in FIG. 3.

As illustrated in FIG. 4, the driver IC 130 may also include a plurality of bumps 133, 135. The bumps 133, 135 face the electrode pads and are electrically connected with electrode pads in the end of each the scan lines 123 and the data lines 125 by interposing conductive material between the bumps and electrode e.g., anisotropic conductive film (not shown).

As may be further seen in FIG. 2, the sealing substrate 140 according to the present invention may have an inner surface 170 and an outer surface 180, such that the driver IC 130 may be disposed on the inner surface 170 of the sealing substrate 140. The driver IC 130 may be disposed on the inner surface 170 of the sealing substrate 140 by any way known in the art, such as adhesion, press-fit disposition between pre-formed ribs, and the like. The sealing substrate 140 may be adhered to the substrate 110 such that the edges of the substrate 110 protrude to the sides. The inner surface 170 of the sealing substrate 140 may be positioned between the sealing substrate 140 and the substrate 110 such that both the driver IC 130 and the OLED 120 are enclosed therebetween and sealed from contact with external atmospheric elements, such as moisture, oxygen, contaminants, and the like.

Reduced contact of the OLED 120 and driver IC 130 with external atmospheric elements may have a beneficial effect on the OLED display overall. The OLED 120 and the driver IC 130 may be protected from corrosion and premature degradation, while the overall mechanical strength of the OLED display may be enhanced by the supporting frame formed by the sealing substrate 140. Moreover, reducing the unused space in the OLED display by employing it for configuration of additional components on the substrate may reduce the overall manufacturing costs of the device.

The sealing substrate 140 of the present invention may be made of any suitable material known in the art, e.g., metal, glass, plastic, and so forth, and it may be affixed to the substrate 110 with an adhesive by any methods known in the art, including, but not limited to, chemical treatment, thermosetting, ultraviolet (UV) curing, and so forth. If UV curing method is employed, the adhesive may have a high curability.

Additionally, the sealing substrate 140 of an embodiment of the present invention may be formed in a shape of a cap, as may be seen in the illustrated embodiment of FIG. 2, or in a shape of a plate (not shown). The space formed between the inner surface 170 of the sealing substrate 140 and the substrate 110 may be predetermined to provide appropriate positioning of the OLED 120 and the driver IC 130.

The sealing substrate 140 of the present invention may also include protecting projections 141. The protecting projections 141 may be longer than the thickness of the driver IC 130. In detail, the protecting projections 141 may be characterized by a longer length, as measured from the inner surface 170 of the sealing substrate 140 to the substrate 110, as compared to the thickness of the driver IC 130, as measured in the same direction as the length of the protecting projections 141. As such, the protecting projections 141 may minimize any contact between the driver IC 130 and other external factors, such as, for example, potential pressure induced by the substrate 110.

In accordance with the present invention and as further illustrated in FIG. 2, the OLED display of an embodiment of the present invention may further include an absorbing layer 150 to provide an additional way for minimizing moisture in the space formed between the inner surface 170 of the sealing substrate 140 and the substrate 110. The absorbing layer 150 may be affixed to the inner surface 170 of the sealing substrate 140. The absorbing layer 150 may be made of a hygroscopic material, such as alkali metal oxides, alkaline earth metal oxides, metal halides, metal sulfates, metal perchlorates, phosphorus pentaoxides, and so forth, and it may also be formed as a polymer nano-particle layer.

In accordance with another embodiment of the present invention, a plurality of driver ICs may be employed for driving the OLED 120. When a plurality of driver ICs is employed, each individual driver IC may control a discrete and separate driver signal line that may correspond to the controlling driver IC.

According to another aspect of the present invention, an exemplary method of producing an OLED display is described below. The substrate 110 may be treated to form a first area and a second area, whereupon the OLED 120, may be affixed by any means known in the art to the first area. The OLED 120 may be electrically connected to a driver signal line having the scan line 123 and the data line 125 by way of its electrodes; while the other ends of the scan line 123 and the data line 125 include electrode pads and are extended towards the second area of the substrate 110.

Next, the sealing substrate 140, having the inner surface 170 and the outer surface 180, may be treated to form, in its inner surface 170, a first area and a second area corresponding to the first and second areas of the substrate 110. For example, the sealing substrate 140 may have portions of its inner surface 170 removed to form the first area having the OLED 120 and the second area having the driver IC 130. Alternatively, the inner surface 170 may have material attached thereto to form the first and second areas. Such treatment may or may not form the protecting projections 141. The driver IC 130 may be affixed to the inner surface 170 of the second area formed in the sealing substrate 140. However, other types of attachments of driver IC 130 to the OLED display, such as, for example, affixing the driver IC 130 directly to the substrate 110, are not excluded from the scope of the present invention.

The data line 125 and scan line 123 extending from the OLED 120 may be electrically connected to the driver IC 130 via electrode pads and bumps 133, 135. In accordance with FIG. 3, data line 125 may be extended perpendicularly from the OLED 120 directly towards the driver IC 130, while scan line 123 may be extended from the OLED 120 in a semi-loop structure surrounding the driver IC 130 towards the opposite side of the driver IC 130 with respect to the connection point of the data line 125. However, the described connection configuration is exemplary and is not to be interpreted to limit the configuration of the driver signal line in any way.

The bumps 133, 135 of the driver IC 130 may be coated with an anisotropic conductive film formed of a conductive ball and subsequently attached to the electrode pads located at the respective ends of data line 123 and the scan line 125, respectively.

Adhesive may be applied to the sealing substrate 140. Subsequently, the sealing substrate 140 with the affixed driver IC 130 may be mounted on the substrate 110 with the affixed OLED 120, such that the inner surface 170 of the sealing substrate 140 is between the sealing substrate 140 and the OLED 120. UV light may be used to cure the adhesive, such that the OLED 120 and the driver IC 130 are enclosed between the inner surface 170 of the sealing substrate 140 and the substrate 110 without contact with external atmospheric elements.

Adhering and sealing of the sealing substrate 140 and the substrate 110 may be done such that the space formed between the sealing substrate 140 and the substrate 110 is of a predetermined size. Further, the adhering and sealing may be done in an inert atmosphere filled with gases, such as nitrogen, argon, and so forth, to minimize any interaction between the OLED 120 and external elements such as moisture and oxygen. Additionally, the absorbing layer 150 may be provided between the inner surface 170 of the sealing substrate 140 and the substrate 110 before the adhering and sealing. For example, the absorbing layer 150 may be adhered to the inner surface 170.

Although embodiments of the present invention have been shown and described, it would be appreciated by those skilled in the art that modifications and changes might be made to the foregoing embodiments without departing from the principles and spirit of the present invention.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting diode (OLED) display, comprising:
   a substrate;
   an OLED;
   a driver IC electrically connected to the OLED;
   a sealing substrate affixed to the substrate, the sealing substrate including:
      inner and outer surfaces, the driver IC and the OLED being enclosed between the inner surface of the sealing substrate and the substrate, and the driver IC being attached to the inner surface of the sealing substrate, and
      protecting projections extending from the inner surface of the sealing substrate to the substrate, at least one protecting projection of the protecting projections being between the driver IC and the OLED and being spaced apart from each of the driver IC and the OLED; and
   an absorbing layer affixed to the inner surface of the sealing substrate.

2. The OLED display as claimed in claim 1, wherein the absorbing layer is made of a hygroscopic material.

3. The OLED display as claimed in claim 1, further comprising a driver signal line having a data line and a scan line.

4. The OLED display as claimed in claim 1, further comprising a plurality of driver ICs.

5. The OLED display as claimed in claim 1, wherein the driver IC includes a plurality of bumps, the bumps being coated with an anisotropic conductive film.

6. The OLED display as claimed in claim 1, wherein the sealing substrate includes three protecting projections having a length longer than a thickness of the driver IC, each of the OLED and the driver IC being enclosed separately of each other in a space between two of the three protecting projections.

7. The OLED display as claimed in claim 1, wherein each of the OLED and the driver IC is on a different surface among the substrate and the inner surface of the sealing substrate.

8. The OLED display as claimed in claim 1, wherein the driver IC is electrically connected via an input line to a source external to the OLED display.

9. The OLED display as claimed in claim 1, wherein the projections are longer than the absorbing layer.

10. The OLED display as claimed in claim 1, wherein the driver IC is on the sealing substrate and spaced apart from the substrate.

11. The OLED display as claimed in claim 1, wherein the absorbing layer overlaps the OLED and is spaced apart therefrom.

12. The OLED display as claimed in claim 11, wherein the absorbing layer is separated from the driver IC by the at least one protecting projection.

13. The OLED display as claimed in claim 1, wherein the projections are spaced apart from the absorbing layer is separated from the driver IC by the at least one protecting projection.

14. A method of forming an organic light-emitting diode (OLED) display, comprising:
   providing a substrate;
   attaching an OLED to the substrate;
   providing a sealing substrate having inner and outer surfaces, the sealing substrate being formed to include protecting projections that extend from the inner surface of the sealing substrate to the substrate;
   attaching a hygroscopic layer to the inner surface of the sealing substrate;
   attaching at least one driver IC between the inner surface of the sealing substrate and the substrate, such that the driver IC is attached to the inner surface of the sealing substrate by way of COG, and each of the driver IC and the OLED is on a different surface among the substrate and the inner surface of the sealing substrate;
   electrically connecting the OLED to the driver IC by way of a driver signal line having electrode pads; and
   securing the sealing substrate and the substrate such that the driver IC and the OLED are enclosed between the inner surface of the sealing substrate and the substrate, such that at least one protecting projection of the protecting projections in the sealing substrate is formed between the driver IC and the OLED to be spaced apart from each of the driver IC and the OLED.

15. The method as claimed in claim 14, wherein securing the sealing substrate and the substrate further comprises forming a predetermined space therebetween.

16. The method as claimed in claim 14, wherein securing the sealing substrate and the substrate is conducted in an inert environment.

17. The method as claimed in claim 14, wherein the driver signal line is electrically connected to the driver IC by attaching the electrode pads to bumps located on the driver IC, the bumps being coated with an anisotropic conductive film.

18. The method as claimed in claim 14, wherein electrically connecting the OLED to the driver IC further comprises electrically connecting a data line of the driver signal line to at least one bump on one side of the driver IC and electrically connecting a scan line to at least one bump on another side of the driver IC.

19. The method as claimed in claim 14, wherein securing the sealing substrate and the substrate includes enclosing each of the OLED and the driver IC separately of each other in a space between two of the protecting projections, the protecting projections being formed to have a length longer than a thickness of the driver IC.

20. An organic light-emitting diode (OLED) display, comprising:
  a substrate;
  an OLED;
  a driver IC electrically connected to the OLED; and
  a sealing substrate affixed to the substrate, the sealing substrate including:
    inner and outer surfaces, the driver IC and the OLED being enclosed between the inner surface of the sealing substrate and the substrate, and
    protecting projections extending from the inner surface of the sealing substrate to the substrate, at least one protecting projection of the protecting projections being between the driver IC and the OLED and being spaced apart from each of the driver IC and the OLED, wherein the protecting projections are integral with the sealing substrate.

* * * * *